US011380675B2

(12) United States Patent
Mong et al.

(10) Patent No.: US 11,380,675 B2
(45) Date of Patent: Jul. 5, 2022

(54) INTEGRATED STACKED ESD NETWORK IN TRENCH FOR TRENCH DMOS

(71) Applicant: Yeuk Yin Mong, Hong Kong (HK)

(72) Inventors: Yeuk Yin Mong, Hong Kong (HK); Mau Lam Lai, Hong Kong (HK); Duc Quang Chau, Hong Kong (HK)

(73) Assignee: Yeuk Mong, Hong Kong (HK)

( * ) Notice: Subject to any disclaimer, the term of this patent is extended or adjusted under 35 U.S.C. 154(b) by 0 days.

(21) Appl. No.: 16/699,057

(22) Filed: Nov. 28, 2019

(65) Prior Publication Data

US 2020/0098744 A1    Mar. 26, 2020

Related U.S. Application Data

(63) Continuation of application No. PCT/CN2019/079608, filed on Mar. 26, 2019.

(30) Foreign Application Priority Data

Mar. 27, 2018   (HK) .................................. 18104189.3

(51) Int. Cl.
*H01L 29/66* (2006.01)
*H01L 29/78* (2006.01)
*H01L 27/02* (2006.01)

(52) U.S. Cl.
CPC ...... *H01L 27/0296* (2013.01); *H01L 27/0255* (2013.01); *H01L 27/0288* (2013.01); *H01L 29/66674* (2013.01); *H01L 29/7801* (2013.01)

(58) Field of Classification Search
CPC ............. H01L 27/0016; H01L 27/0296; H01L 27/0251; H01L 27/0255; H01L 27/0288;
(Continued)

(56) References Cited

U.S. PATENT DOCUMENTS 6,515,345 B2 * 2/2003 Robb .................... H01L 21/761
257/105
8,053,808 B2 * 11/2011 Su ........................ H01L 29/7808
257/173
(Continued)

FOREIGN PATENT DOCUMENTS

CN    101692425 A    4/2010
CN    103258814 A    8/2013

OTHER PUBLICATIONS

International Search Report of PCT/CN2019/079608, dated Jun. 25, 2019.

*Primary Examiner* — Natalia A Gondarenko
(74) *Attorney, Agent, or Firm* — W&KIP

(57) ABSTRACT

A stacked ESD structure comprises a heavily doped substrate; an epitaxial layer grown on the substrate; a trench formed in the epitaxial layer; an oxide layer formed on an inner sidewall of the trench; first and second poly layers formed in the trench; a plurality of P-type regions and N-type regions formed inside the first and second poly layers to make back to back diodes in the first and second poly layers respectively; a dielectric layer formed in the trench, between the first and second poly layers; an insulating layer formed on top of the second poly layer and the trench; a plurality of contact defined to connect the first poly layer, the poly resistor and the second poly layer, through the insulating layer; and a metal layer formed on top of the insulating layer.

13 Claims, 10 Drawing Sheets

(58) Field of Classification Search
CPC ... H01L 27/0705–0738; H01L 27/0802; H01L 27/0623–0635; H01L 27/0647; H01L 27/0652; H01L 27/0664–0676; H01L 27/0711–0727; H01L 27/075–0766; H01L 27/0783; H01L 27/0788; H01L 27/0266; H01L 27/0259; H01L 27/101; H01L 28/20–26; H01L 29/7821; H01L 29/7801; H01L 29/7802; H01L 29/7834; H01L 29/4236; H01L 29/42352; H01L 29/66712; H01L 29/66734; H01L 29/66674; H01L 29/66113; H01L 29/66106; H01L 29/7808; H01L 2924/1207; H01L 2924/1306; H01L 2924/13091
USPC ....... 257/173, 355, 551, 105, 106, 481, 601, 257/328, 27.016
See application file for complete search history.

(56) References Cited

U.S. PATENT DOCUMENTS

| | | | |
|---|---|---|---|
| 8,564,047 B2* | 10/2013 | Hsieh | H01L 29/866 257/328 |
| 10,438,941 B2* | 10/2019 | Tsai | H01L 27/0255 |
| 2002/0175367 A1 | 11/2002 | Hshieh | |
| 2008/0029820 A1 | 2/2008 | Disney et al. | |
| 2009/0212354 A1 | 8/2009 | Hsieh | |
| 2014/0210007 A1 | 7/2014 | Deval et al. | |
| 2017/0104095 A1 | 4/2017 | Lai et al. | |
| 2018/0301553 A1* | 10/2018 | Weyers | H01L 27/0255 |

* cited by examiner

INTEGRATED STACKED ESD NETWORK IN TRENCH FOR TRENCH DMOS

This application is a continuation application of International Patent Application No. PCT/CN2019/079608 with an international filing date of Mar. 26, 2019, designating the United States, now pending, and further claims priority benefits to Hong Kong Patent Application No. 18104189.3, filed on Mar. 27, 2018. The contents of all of the aforementioned applications are incorporated herein by reference.

FIELD OF THE INVENTION

The present invention relates to Trench Double-diffused Metal-Oxide-Semiconductor Field Effect Transistor (hereinafter "Trench DMOS"), and more particularly to ESD (Electrostatic Discharge) protection for Trench DMOS.

BACKGROUND OF THE INVENTION

ESD is a common cause of failure in solid state electronic components during manufacturing. High ESD voltage can cause damage to the Gate oxide in Trench DMOS, leading to instant failure or secondary failure. ESD protection in component level is essential to prevent such damage.

A pair or several pairs of back to back PN diodes are often used to divert the high ESD charges away before the voltage is high enough to damage the Gate oxide. Since technology keeps advancing, the Die size of Trench DMOS is shrinking and the intrinsic ESD capability is also shrinking. A single stage of ESD diodes is not adequate and two stages of ESD diodes with resistor in between are often required to handle higher ESD voltage.

Usually in Trench DMOS, ESD structure is formed in the poly layer at Gate pad. In modern contact on trench process, a layer of poly on top of silicon surface means extra topology, which makes masking layer like contact masking difficult. Also two stages of ESD diodes with resistor in between need complicated layout and metal routing.

SUMMARY OF THE INVENTION

For the defects in the prior art, an object of the present invention is to provide a stacked ESD network placed inside the trench which offers good ESD protection capability, flat topology and simple metal routing.

The technical solutions of the present invention are as follows:

In one aspect, a stacked ESD structure is provided, which comprises: a heavily doped substrate acting as a drain; an epitaxial layer grown on the substrate; a trench formed in the epitaxial layer; an oxide layer formed on an inner sidewall of the trench; a first poly layer formed in the trench; a plurality of P-type regions and N-type regions formed inside the first poly layer to make back to back diodes in the first poly layer; a dielectric layer formed in the trench, on top of the first poly layer; a second poly layer formed in the trench, on top of the dielectric layer; a plurality of P-type regions and N-type regions formed inside the second poly layer to make back to back diodes and poly resistors in the second poly layer; an insulating layer formed on top of the second poly layer and the trench; a plurality of contact defined to connect the first poly layer, the poly resistor and the second poly layer, through the insulating layer; and a metal layer formed on top of the insulating layer.

Advantageously, a thickness of the epitaxial layer is about 2~50 μm.

Advantageously, the oxide layer covers a bottom and sidewalls of the trench.

Advantageously, the first poly layer is un-doped and the first poly layer is inside the trench.

Advantageously, blanket ESD implant and masked N+ implant are used to form the back to back diodes in the first and second poly layers.

Advantageously, the number of pair of ESD back to back diodes in each poly layer is one; or the number pair of ESD back to back diodes in series is more than one; the number of pair of ESD back to back diodes can be the same or different in the first and second poly layers.

Advantageously, the dielectric layer is oxide or nitride or composite of both material, and a thickness of the dielectric layer is about 0.2~1 μm Advantageously, the second poly layer is un-doped and the second poly layer is also inside the trench.

Advantageously, the stack of first poly layer and second poly layers are inside the trench.

Advantageously, the poly resistor is in stripe form with one or two sides connected to the second poly layer and is defined in the center of the second poly layer.

Advantageously, the insulating layer is a layer of borophosphosilicate glass or a composite layer of un-doped silicate glass and borophosphosilicate glass.

Advantageously, the source contact of the first poly layer and the second poly layer can be defined at one side or more than one side.

Advantageously, simple metal routing is needed to connect two stages of ESD back to back diodes with resistors.

In another aspect, a method for preparing the stacked ESD structure is provided, which comprises: providing a heavily doped substrate acting as a drain; growing an epitaxial layer on the substrate; forming a trench in the epitaxial layer; forming an oxide layer on an inner sidewall of the trench; forming a first poly layer in the trench; forming a plurality of P-type regions and N-type regions inside the first poly layer to make back to back diodes in the first poly layer; forming a dielectric layer in the trench, on top of the first poly layer; forming a second poly layer in the trench, on top of the dielectric layer; forming a plurality of P-type regions and N-type regions inside the second poly layer to make back to back diodes and poly resistors in the second poly layer; forming an insulating layer on top of the second poly layer and the trench; defining a plurality of contact to connect the first poly layer, the poly resistor and the second poly layer, through the insulating layer; and forming a metal layer on top of the insulating layer.

Advantageously, the first poly layer is un-doped and the first poly layer is inside the trench.

Advantageously, blanket ESD implant and masked N+ implant are used to form the back to back diodes in the first and second poly layers.

Advantageously, the second poly layer is un-doped and the second poly layer is also inside the trench.

Advantageously, the stack of first poly layer and second poly layers are inside the trench.

Advantageously, the poly resistor is in stripe form with one or two sides connected to the second poly layer and is defined in the center of the second poly layer.

The stacked ESD network placed inside the trench offers good ESD protection capability, flat topology and simple metal routing.

DETAILED DESCRIPTION OF THE EMBODIMENTS

Figure 1:
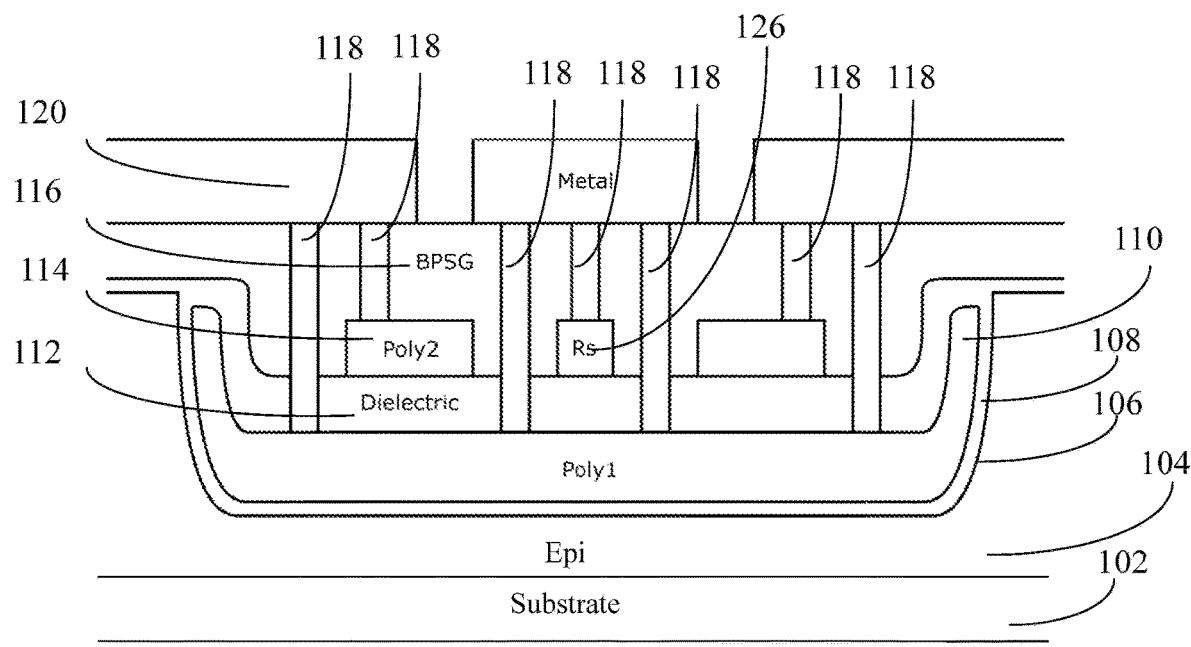
FIG. 1 is a cross section view of a stacked ESD structure according to a first embodiment of the present invention.

The present invention will now be more particularly described, by way of example only, with reference to the accompanying drawings. It should be understood that the drawing are for better understanding and should not limit the present invention. Dimensions of components and features shown in the drawings are generally chosen for convenience and clarity of presentation and are not necessarily shown to scale.

Figure 2:
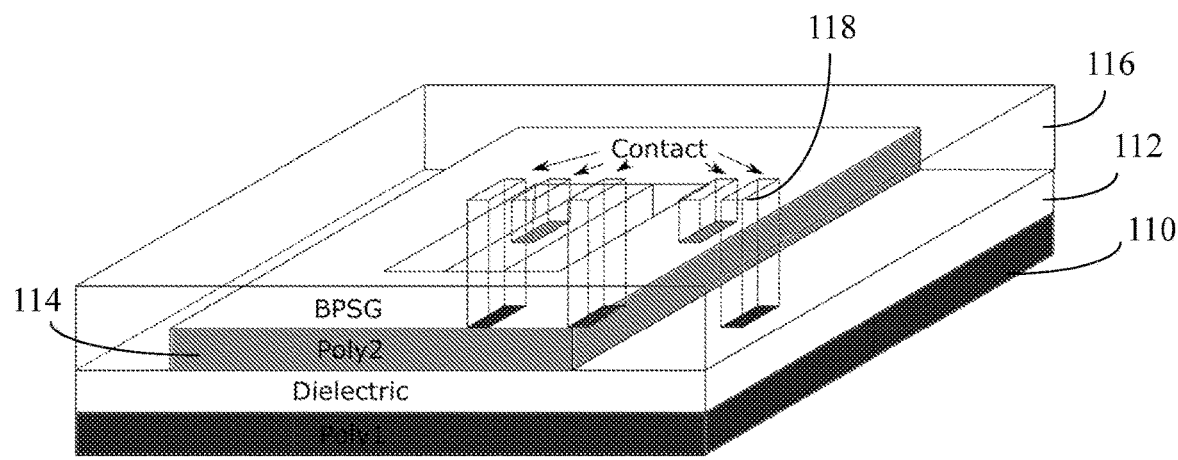
FIG. 2 is a three dimensional view of the stacked ESD structure according to the first embodiment of the present invention.

Referring to FIGS. 1 and 2, a stacked ESD structure according to a first embodiment of the present invention includes a substrate 102 and an epitaxial layer 104 grown on the substrate 102. The substrate 102 acts as a drain of the trench DMOS, which is N-type or P-type semiconductor and heavily doped. The epitaxial layer 104 is the same type semiconductor as the substrate and lightly doped. A thickness of the epitaxial layer 104 is usually 2~50 μm.

The stacked ESD structure further includes a trench 106 defined in the epitaxial layer 104 and at the Gate pad area, and an oxide layer 108 formed in the trench 106, covering the bottom and sidewalls of the trench 106.

Figure 16:
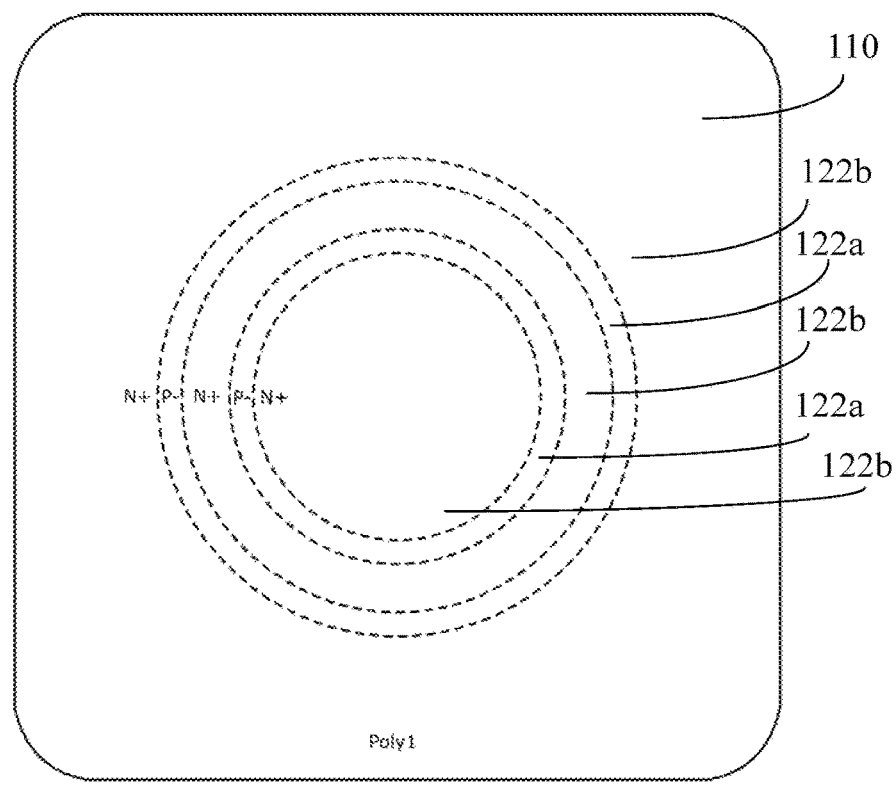
FIGS. 16 to 22 show some of the steps of making the stacked ESD structure in FIG. 1 in top view.

The stacked ESD structure further includes a first poly layer 110 formed in the trench 106, a plurality of P-type regions 122a and N-type regions 122b formed inside the first poly layer 110 as shown in FIG. 16 to make back to back diodes in the first poly layer 110. The first poly layer 110 is un-doped and the first poly layer 110 is inside the trench. Blanket ESD implant and masked N+ implant are used to form the ESD diodes.

The stacked ESD structure further includes a dielectric layer 112 formed in the trench 106, on top of the first poly layer 110. The dielectric layer 112 can be oxide or nitride or composite of both materials. The thickness of the dielectric layer 112 is usually 0.2~1 μm.

Figure 17:
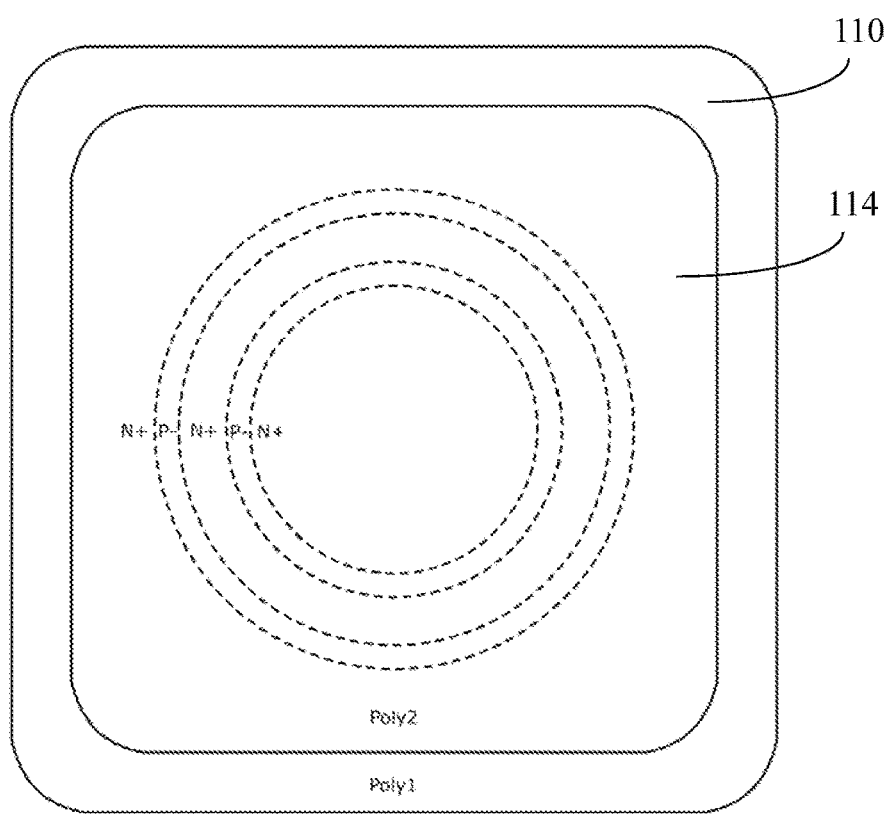

The stacked ESD structure further includes a second poly layer 114 formed in the trench 106, on top of the dielectric layer 112, a plurality of P-type regions 124a and N-type regions 124b formed inside the second poly layer 114 as shown in FIG. 17 to make back to back diodes. This back to back ESD diode directly connects to poly resistors 126 in the second poly layer 114. The second poly layer 114 is un-doped and the top of the second poly layer 114 is not higher than the top of the trench 106. Blanket ESD implant and masked N+ implant are used to form the ESD diodes. The poly resistor 126 is defined in the center of the second poly layer. Depending on design specification, the poly resistor 126 could be in stripe form with one or two sides connected to the second poly layer 114.

Figure 18:
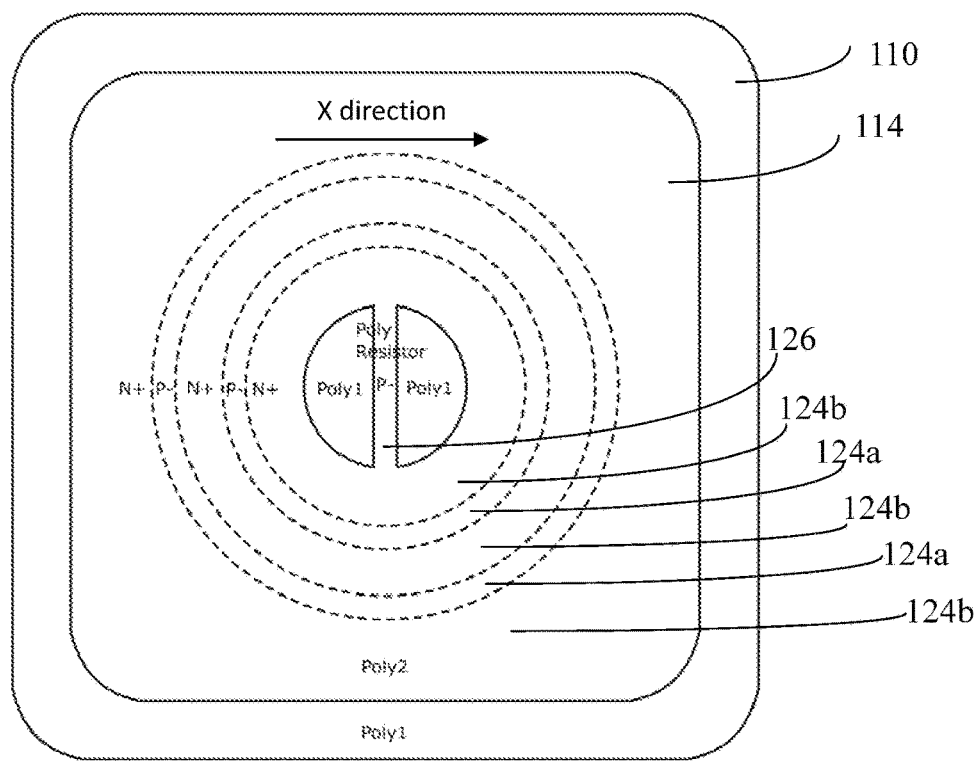
Figure 19:
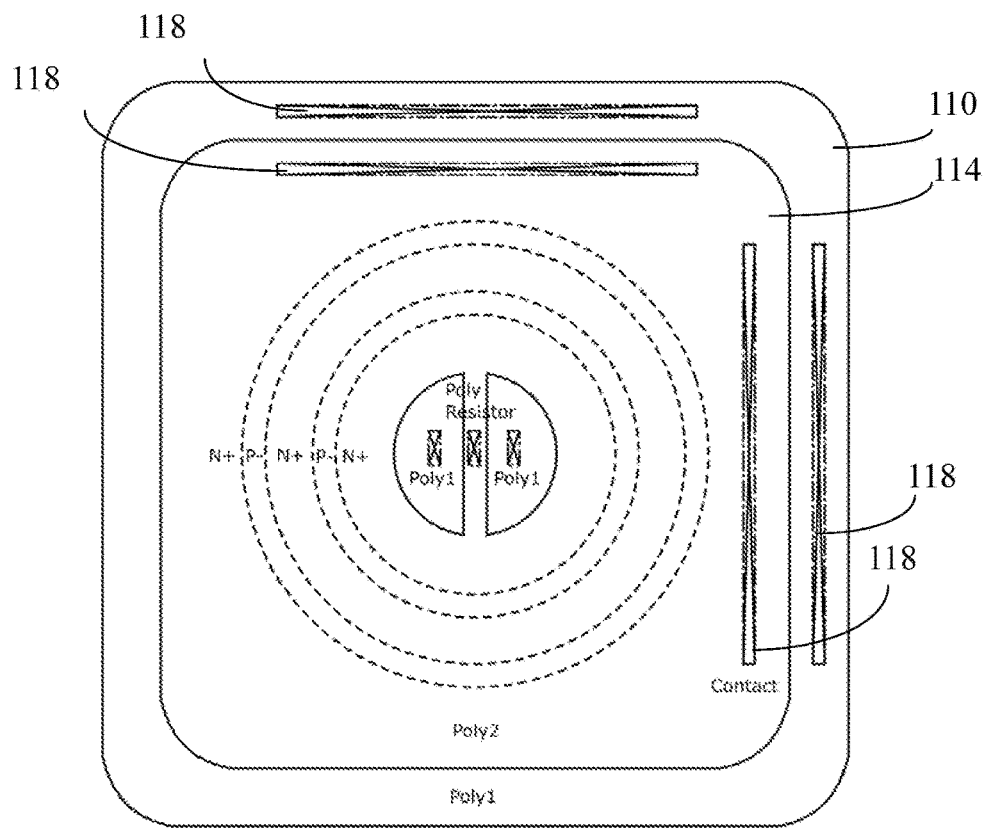
Figure 20:
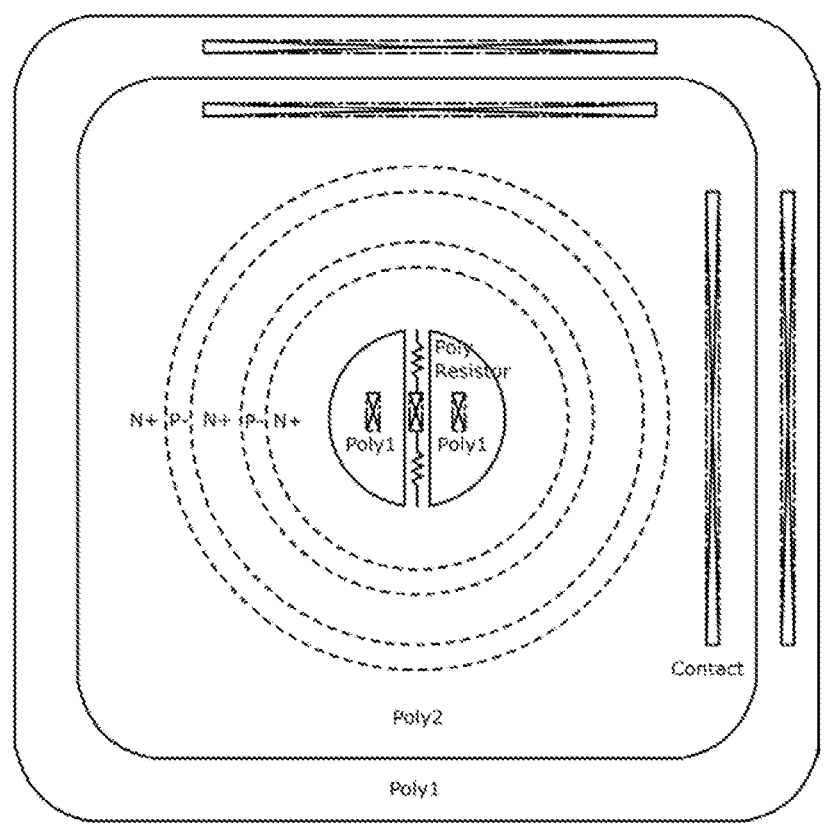
Figure 21:
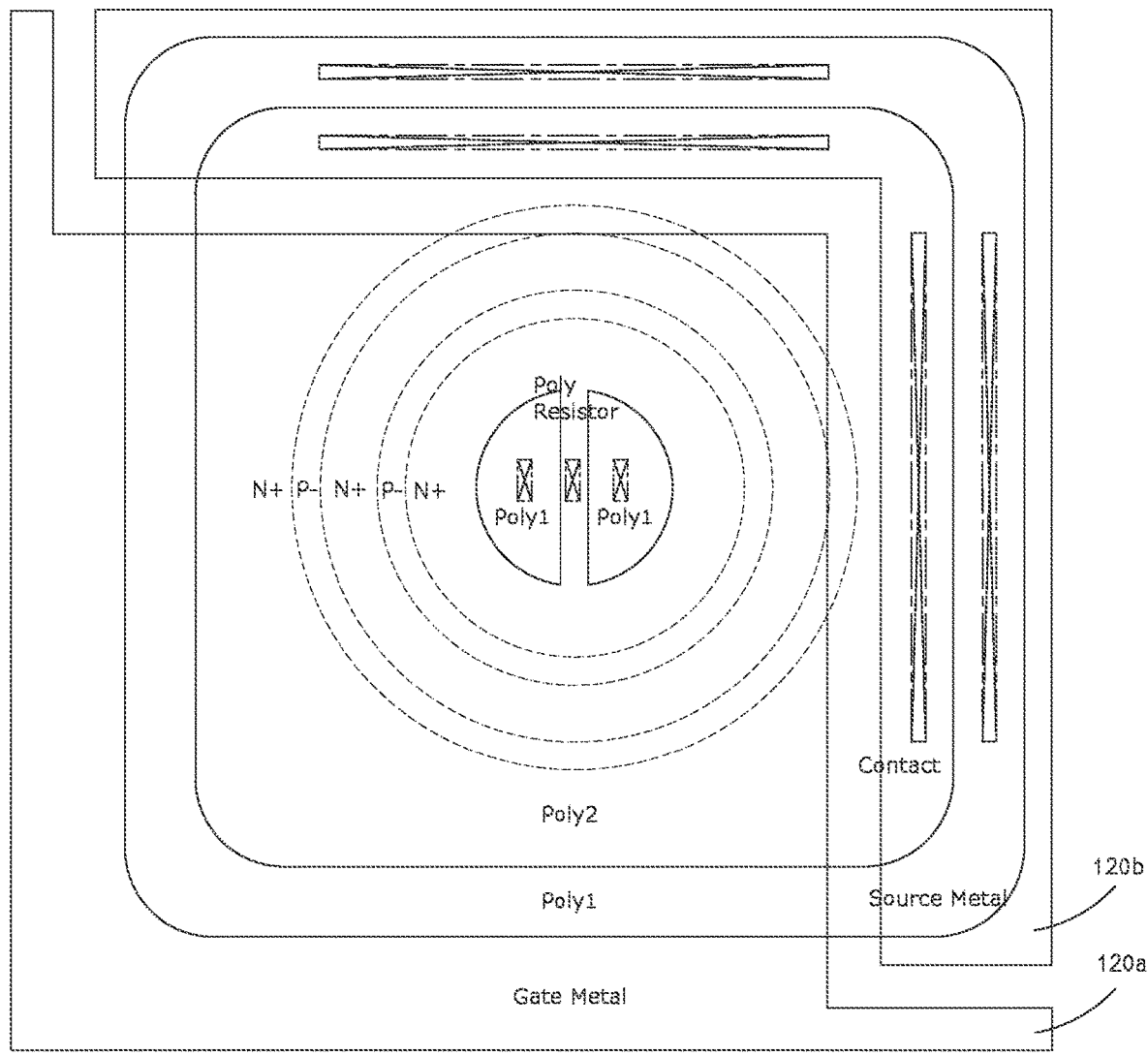
Figure 22:
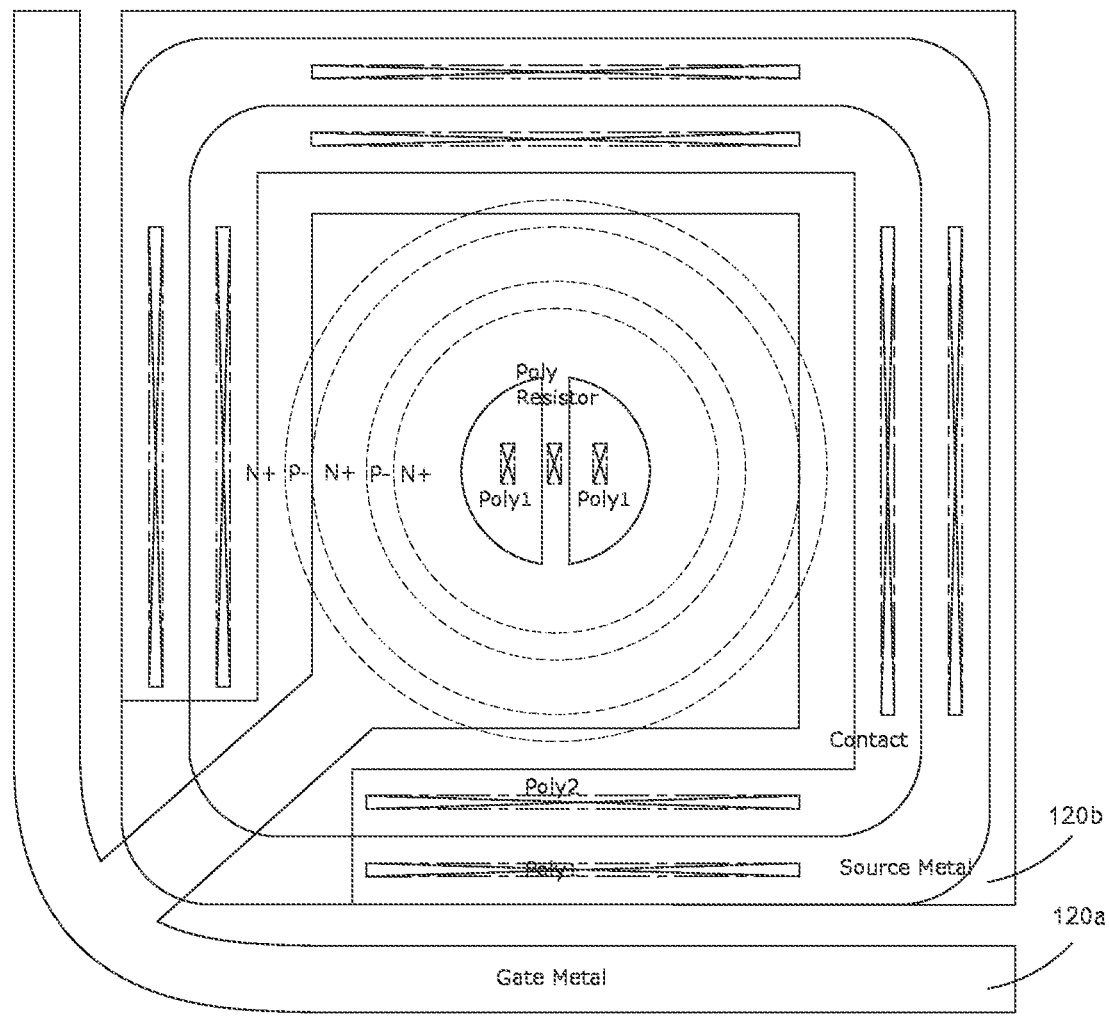

The stacked ESD structure further includes an insulating layer 116 formed on the surface of the epitaxial layer 104 and covering the trench 106. The insulating layer 116 is usually BPSG (Borophosphosilicate glass) or composite of USG (Undoped Silicate Glass) and BPSG. As shown in FIGS. 1, 2 and 18, Contact holes 118 are defined in the insulating layer 116 and extend to the poly resistor 126, the second poly layer 114 and the first poly layer 110.

The stacked ESD structure may further includes a metal layer 120 formed on the insulating layer 116. The metal layer 120 fills into the contact holes 118, which connects to the poly resistors 126 and the first poly layer 110 to the Gate terminal, and connects the other end of the second poly layer 114 and the other end of the first poly layer 110 to the Source terminal as shown in FIG. 18.

An example method to form the present ESD structure integrated in trench DMOS will be described in detail as follows.

Figure 3:
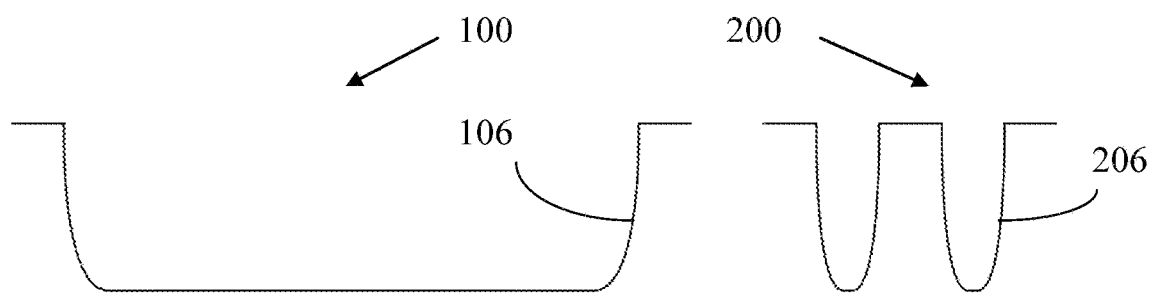
FIGS. 3 to 15 show steps of making the stacked ESD structure in FIG. 1 in cross-section view.

Firstly, as shown in FIG. 1 a heavily doped N-type substrate 102 is provided and an N-type epitaxial layer 104 is grown on a surface of the substrate 102. As shown in FIG. 3, a first mask is then used to define a trench pattern. Silicon etch is employed to etch the epitaxial layer 104 to a pre-defined depth to form the trench 106 for ESD structure 100 and the trench 206 in cell area 200.

Figure 4:
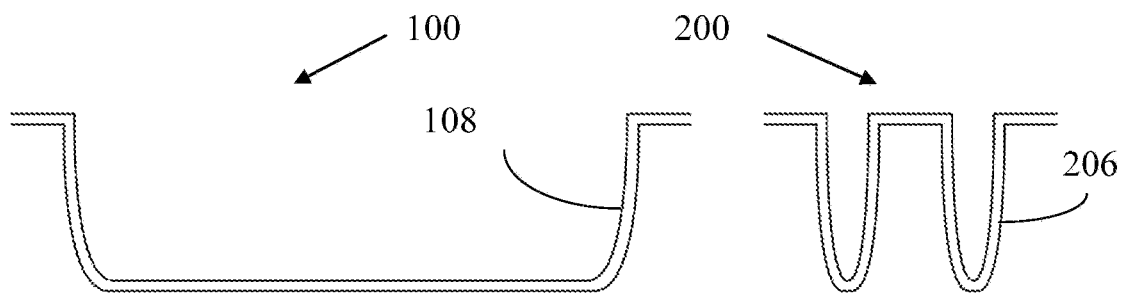
Figure 5:
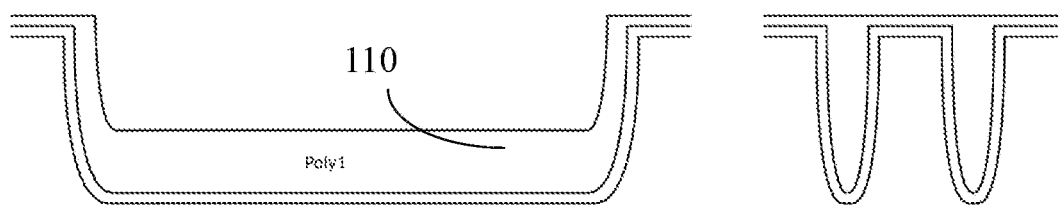
Figure 6:
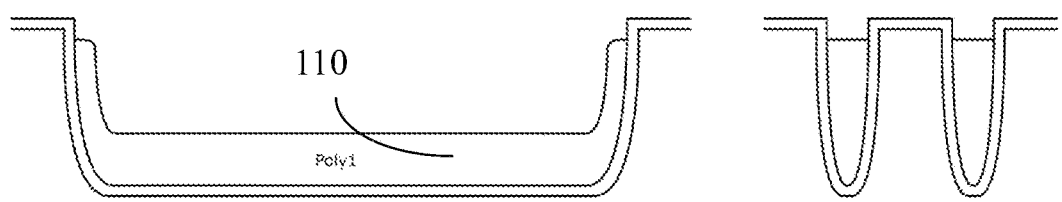
Figure 7:
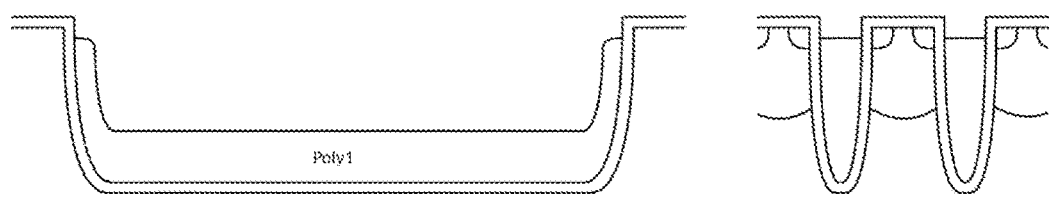

As shown in FIG. 4, a gate oxide layer 108 is then formed in the trenches 106 and 206. As shown in FIG. 5, A first poly layer 110, which is un-doped, is then deposited and etched back as shown in FIG. 6. As shown in FIG. 7, a light P-type region is formed by blanket implanting light P-type impurity into the first poly layer 110. A masked body region is formed by implanting P-type impurity into the epitaxial layer in the cell area 200 between the cell trenches 206. A heavy N-type region is formed by masked implanting heavy N-type impurity into the first poly layer 110, thus forming back to back diodes in the first poly layer 110, and into the epitaxial layer 104 between the cell trenches 206 in the cell area 200.

Figure 8:
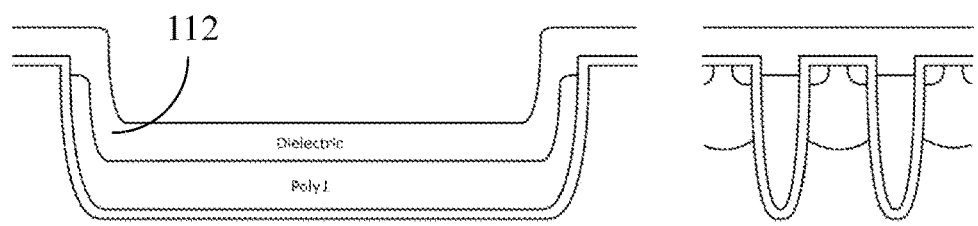
Figure 9:
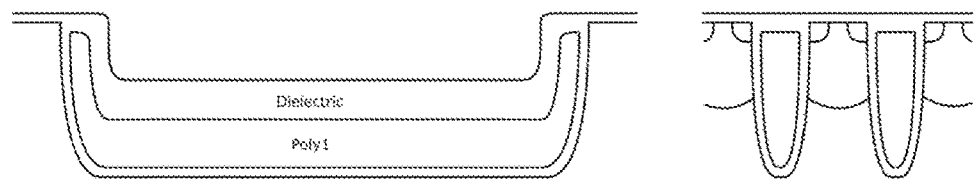
Figure 10:
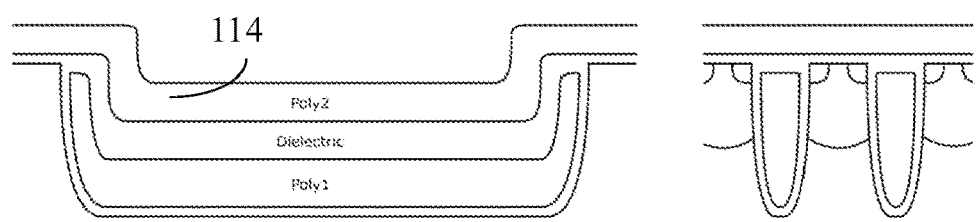
Figure 11:
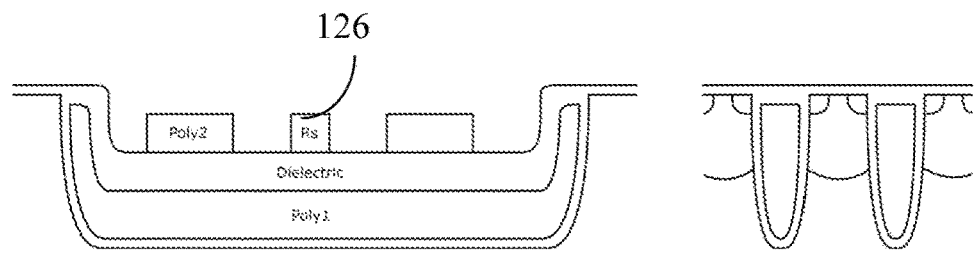

As shown in FIGS. 8 and 9, an insulating layer 112 is then deposited to cover the epitaxial layer 104 and the trenches 106 and 206. As shown in FIG. 10, A second poly layer 114, which is un-doped, is then deposited on the insulating layer 112. As shown in FIG. 11, a light P-type region is formed by blanket implanting light P-type impurity into the second poly layer 114 and a heavy N-type region is formed by masked implanting heavy N-type impurity into the second poly layer 114, thus forming back to back diodes and the poly resistors 126 in the second poly layer 114.

Figure 12:
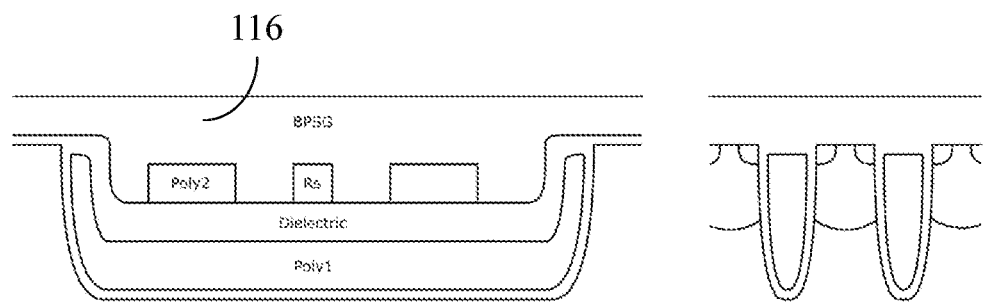
Figure 13:
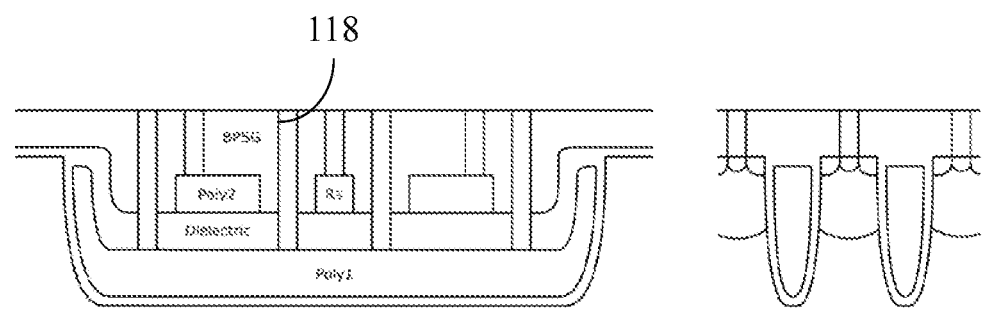

As shown in FIG. 11, a mask is used to define the second poly layer pattern, thus separating the back to back diodes and the poly resistor 126 in x-direction. As shown in FIG. 12, an insulating layer 116 is formed on the surface of the epitaxial layer 104 and covers the trenches 106 and 206. The insulating layer 116 is usually BPSG (Borophosphosilicate glass) or composite of USG (Undoped Silicate Glass) and BPSG. As shown in FIG. 13, a contact mask is used to define contact holes 118 in the insulating layer 116 and extend to the poly resistor 126, the second poly layer 114 and the first poly layer 110 in the ESD structure 100, and to the body region in cell area 200. Removing the oxide in the contact holes 118, the contact holes 118 reach the poly resistor 126, the second poly layer 114 and the first poly layer 110 in the ESD structure 100, and to the body region in cell area 200.

Figure 14:
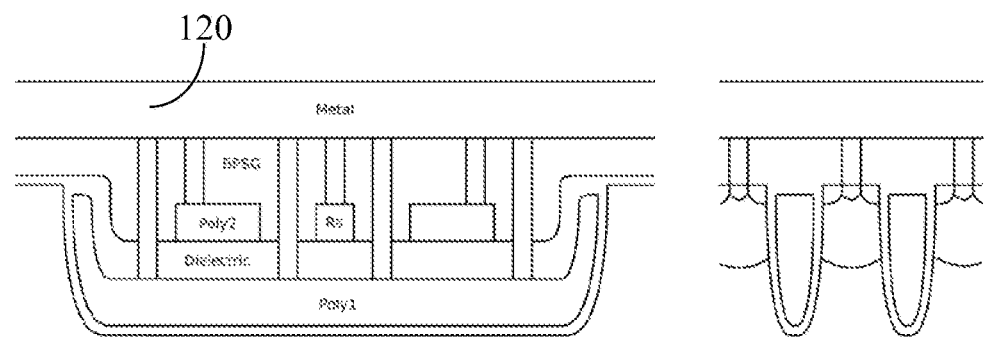
Figure 15:
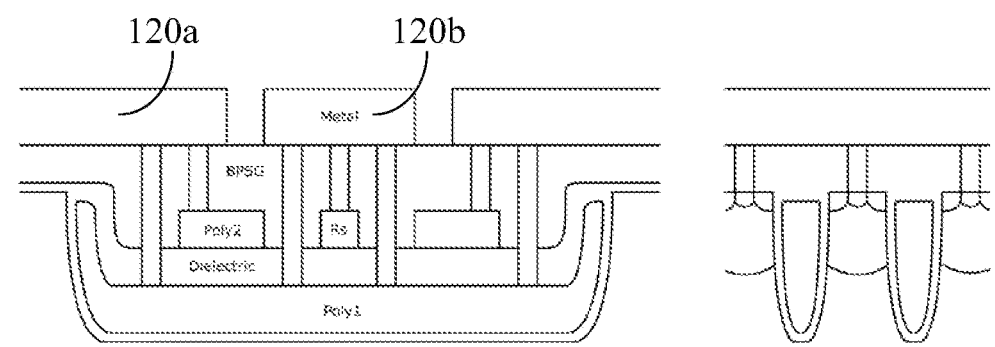

As shown in FIG. 13, P+ dopant is then implanted into the body region via the contact holes 118 to form a P+ body pickup region. Finally, as shown in FIG. 1, a metal layer 120 is deposited over the insulating layer 116 and fills up the contact holes 118 as shown in FIG. 14. As shown in FIG. 15, a metal mask is used to define the source and gate pad regions in the metal layer 120. The Gate metal 120a connects one side of the poly resistors 126 and one side of the first poly layer 110. The Source metal 120b connects the other side of the second poly layer 114 and the other side of the first poly layer 110.

Notably, some of the reference numbers in FIGS. 3-15 have been omitted for a better view to the structure. The reference numbers omitted in FIGS. 3-15 have been shown in FIG. 1. One of ordinary skill in the art can refer to FIG. 1 for a better understand to FIGS. 3-15.

Some of above steps for making the stacked ESD structure is also shown in FIGS. 16-22 in top view. FIGS. 16-22 are provided here for better understanding of the structure shown in FIG. 1.

Figure 23:
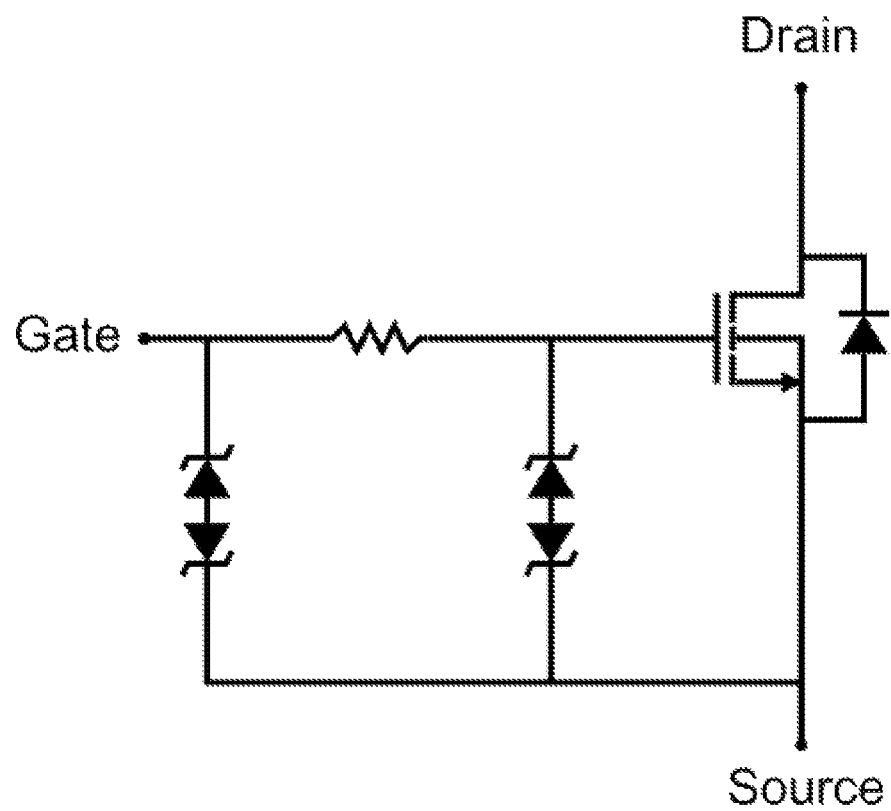
FIG. 23 is a schematic diagram of a two-stage ESD structure.

As an example, FIG. 23 shows a schematic diagram of a two-stage ESD structure.

Although the invention is described with reference to one or more preferred embodiments, it should be appreciated by those skilled in the art that various modifications are possible. Therefore, the scope of the invention is to be determined by reference to the claims that follow.

We claim:

1. A stacked Electrostatic Discharge (ESD) structure, comprising:
   a heavily doped substrate acting as a drain;
   an epitaxial layer grown on the substrate;
   a trench formed in the epitaxial layer;
   an oxide layer formed on an inner sidewall of the trench;
   a first poly layer formed in the trench;
   a plurality of P-type regions and N-type regions formed inside the first poly layer to make back to back diodes in the first poly layer;
   a dielectric layer formed in the trench, on top of the first poly layer;
   a second poly layer formed in the trench, on top of the dielectric layer;
   a plurality of P-type regions and N-type regions formed inside the second poly layer to make back to back diodes and poly resistors in the second poly layer;
   an insulating layer formed on top of the second poly layer and the trench;
   a plurality of contacts defined to connect the first poly layer, the poly resistor and the second poly layer, through the insulating layer; and
   a metal layer formed on top of the insulating layer.

2. The stacked ESD structure of claim 1, wherein, a thickness of the epitaxial layer is about 2~50 µm.

3. The stacked ESD structure of claim 1, wherein the oxide layer covers a bottom and sidewalls of the trench.

4. The stacked ESD structure of claim 1, wherein the first poly layer is un-doped before the plurality of P-type regions and N-type regions are formed inside the first poly layer and the first poly layer is inside the trench.

5. The stacked ESD structure of claim 1, wherein blanket ESD implant and masked N+ implant are used to form the back to back diodes in the first poly layer and the second poly layer.

6. The stacked ESD structure of claim 1, wherein a number of pair of ESD back to back diodes in each poly layer is one; or a number pair of ESD back to back diodes in series is more than one; the number of pair of ESD back to back diodes being the same or different in the first poly layer and the second poly layer.

7. The stacked ESD structure of claim 1, wherein the dielectric layer is oxide or nitride or composite of both material, and a thickness of the dielectric layer is about 0.2~1 µm.

8. The stacked ESD structure of claim 1, wherein the second poly layer is un-doped before the plurality of P-type regions and N-type regions are formed inside the second poly layer and the second poly layer is also inside the trench.

9. The stacked ESD structure of claim 1, a stack of the first poly layer and the second poly layer are inside the trench.

10. The stacked ESD structure of claim 1, wherein the poly resistor is in stripe form with one or two sides connected to the second poly layer and is defined in a center of the second poly layer.

11. The stacked ESD structure of claim 1, wherein the insulating layer is a layer of borophosphosilicate glass or a composite layer of un-doped silicate glass and borophosphosilicate glass.

12. The stacked ESD structure of claim 1, wherein a source contact of the first poly layer and the second poly layer is defined at one side or more than one side.

13. The stacked ESD structure of claim 1, wherein metal routing is provided to connect two stages of ESD back to back diodes with resistors.

* * * * *